United States Patent
Kimura et al.

(10) Patent No.: US 9,881,852 B2
(45) Date of Patent: Jan. 30, 2018

(54) SEMICONDUCTOR MODULE

(71) Applicant: DENSO CORPORATION, Kariya, Aichi-pref. (JP)

(72) Inventors: Mitsunori Kimura, Kariya (JP); Hiroshi Shimizu, Kariya (JP); Kengo Mochiki, Kariya (JP); Yasuyuki Ohkouchi, Kariya (JP); Yuu Yamahira, Kariya (JP); Tetsuya Matsuoka, Kariya (JP); Kazuma Fukushima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/491,028

(22) Filed: Apr. 19, 2017

(65) Prior Publication Data

US 2017/0301614 A1 Oct. 19, 2017

(30) Foreign Application Priority Data

Apr. 19, 2016 (JP) ................... 2016-083935

(51) Int. Cl.
| | |
|---|---|
| *H01L 23/12* | (2006.01) |
| *H01L 23/31* | (2006.01) |
| *H01L 23/495* | (2006.01) |
| *H01L 25/00* | (2006.01) |
| *H01L 25/07* | (2006.01) |
| *H01L 25/16* | (2006.01) |
| *H01L 23/00* | (2006.01) |
| *H01L 27/06* | (2006.01) |
| *H02M 7/537* | (2006.01) |
| *H02P 27/06* | (2006.01) |

(52) U.S. Cl.
CPC .... *H01L 23/49568* (2013.01); *H01L 23/3114* (2013.01); *H01L 23/49562* (2013.01); *H01L 23/49575* (2013.01); *H01L 24/32* (2013.01); *H01L 27/0623* (2013.01); *H01L 2224/32245* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01); *H02M 7/537* (2013.01); *H02P 27/06* (2013.01)

(58) Field of Classification Search
CPC ......... H01L 23/49575; H01L 23/49562; H01L 24/32; H01L 2924/10253; H01L 2924/1033; H01L 2924/10272; H01L 2914/1309; H01L 2224/32245; H01L 23/49568; H01L 23/3114; H01L 2924/13091; H01L 2924/13055
See application file for complete search history.

(56) References Cited

U.S. PATENT DOCUMENTS

| | | | |
|---|---|---|---|
| 2013/0155745 A1 | 6/2013 | Tanaka et al. | |
| 2014/0055173 A1 | 2/2014 | Shiraishi et al. | |
| 2015/0145111 A1* | 5/2015 | Mengel | ................ H01L 25/165 257/675 |

* cited by examiner

*Primary Examiner* — Jasmine Clark
(74) *Attorney, Agent, or Firm* — Oliff PLC

(57) ABSTRACT

A semiconductor module of an electric power converter includes an IGBT and a MOSFET which are connected in parallel to each other and provided on the same lead frame, either one of the IGBT and the MOSFET is a first switching element and the remaining one is a second switching element, and the conduction path of the second switching element is disposed at a position that is separated from a conduction path of the first switching element in the same lead frame.

10 Claims, 12 Drawing Sheets

SEMICONDUCTOR MODULE

CROSS-REFERENCE TO RELATED APPLICATION

This application is based on and claims the benefit of priority from earlier Japanese Patent Application No. 2016-83935 filed Apr. 19, 2016, the description of which is incorporated herein by reference.

TECHNICAL FIELD

The present disclosure relates to a semiconductor module.

BACKGROUND

Conventionally, as a semiconductor module constituting an electric power converter, a configuration in which an IGBT excellent in performance in a high current region is combined with a MOSFET with excellent performance in a low current region is known.

For example, JP 5863599 and JP 5805513 each disclose a semiconductor module (power module) provided with an IGBT and a MOSFET which are connected in parallel with each other.

This semiconductor module is advantageous in that it has both excellent characteristics of IGBT and MOSFET.

When designing a semiconductor module provided with both the IGBT and the MOSFET, there is a requirement that thermal influence (also referred to as thermal damage) such that the two switching elements thermally interfere with each other is suppressed from occurring.

In response to this demand, the semiconductor module disclosed in JP 58563599 adopts a structure that does not positively cool the MOSFET with high heat resistance so that the IGBT is likely to receive thermal influence from the MOSFET when the temperature of the MOSFET becomes high.

Moreover, in the semiconductor module disclosed in JP 5805513 is constituted that a current flows through the bus bar directly under the MOSFET when the IGBT is energized, and the MOSFET is likely to receive thermal influence from the bus bar in a high temperature state.

SUMMARY

An embodiment provides a semiconductor module in which a switching element is less likely to receive thermal influence.

An aspect of a semiconductor module includes an IGBT and a MOSFET connected in parallel to each other and provided on the same lead frame. Either one of the IGBT and the MOSFET is a first switching element and the remaining one is a second switching element, and the second switching element is disposed at a position that is separated from a conduction path of the first switching element in the same lead frame.

Another aspect of a semiconductor module includes a plurality of semiconductor element pairs of which IGBTs and MOSFETs thereof are connected in parallel to each other, the semiconductor element pairs being connected in series between a high potential side line and a low potential side line of a power supply, and provided on the same lead frame.

Either ones of a plurality of IGBTs and a plurality of MOSFETs included in the plurality of semiconductor element pairs are a plurality of first switching elements and the remaining ones are a plurality of second switching elements.

The plurality of first switching elements are driven prior to the plurality of second switching elements.

In a semiconductor element pair disposed between the high potential side line and an AC output line among the plurality of semiconductor element pairs, the second switching element is disposed at a position separated from a conduction path formed between the high potential side line and the AC output line via the first switching element.

In a semiconductor element pair disposed between the low potential side line and the AC output line among the plurality of semiconductor element pairs, the second switching element is disposed at a position separated from a conduction path formed between the low potential side line and the AC output line via the first switching element.

In the semiconductor module of the first aspect described above, the second switching element is less likely to be thermally influenced by heat generated in the conduction path of the first switching element when the first switching element is driven.

Similarly, the first switching element is less likely to be thermally influenced by heat generated in the conduction path of the second switching element when the second switching element is driven.

That is, the thermal influence that the two switching elements can have on each other can be suppressed from influencing.

In the semiconductor module of the second aspect described above, since the second switching element is not disposed on the conduction path of the first switching element that is driven first, the second switching element is less likely to be thermally influenced by heat generated in the conduction path.

As described above, according to each of the above-described aspects, it is possible to provide a semiconductor module in which the switching element is less likely to receive to thermal influence.

DETAILED DESCRIPTION OF THE PREFERRED EMBODIMENT

Figure 1:
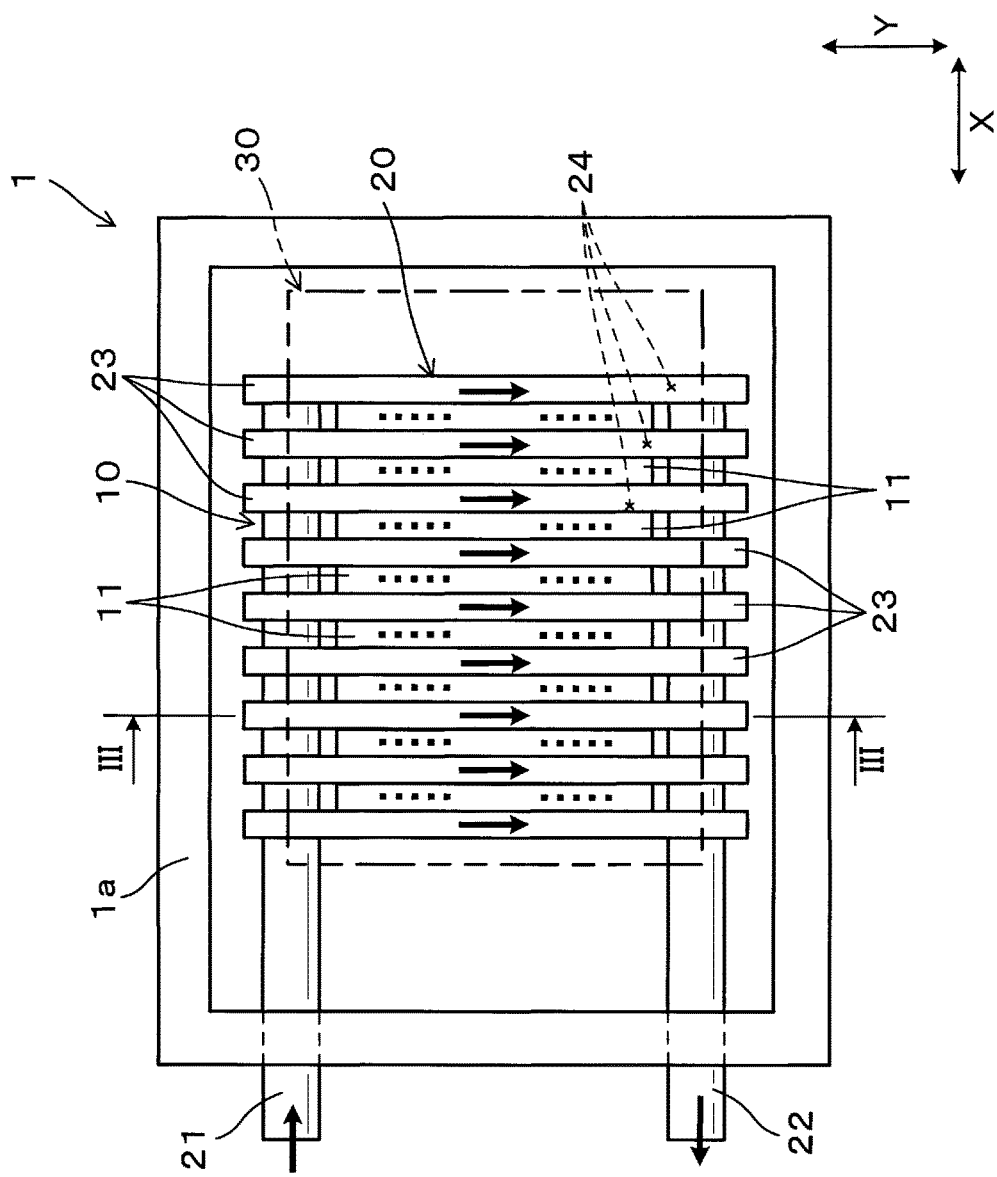
FIG. 1 shows a schematic plan view of an electric power converter according to a first embodiment.

Hereinafter, an embodiment relating to an electric power converter will be described with reference to the drawings.

It should be appreciated that, in the drawings of the present specification, a first direction that is a stacking direction of semiconductor modules and cooling pipes is indicated by an arrow X, a second direction that is a longitudinal direction of the cooling pipe is indicated by an arrow Y, and a third direction orthogonal to both the first direction and the second direction is indicated by an arrow Z, unless otherwise specified.

An electric power converter of the present embodiment is an apparatus that converts electric power.

This electric power converter is mounted in an electric vehicle, a hybrid vehicle, or the like, for example, and is used as an inverter for converting DC power into AC power necessary for driving a driving motor, and is also used as a converter for converting DC power into boosted or stepped DC power.

First Embodiment

Figure 2:
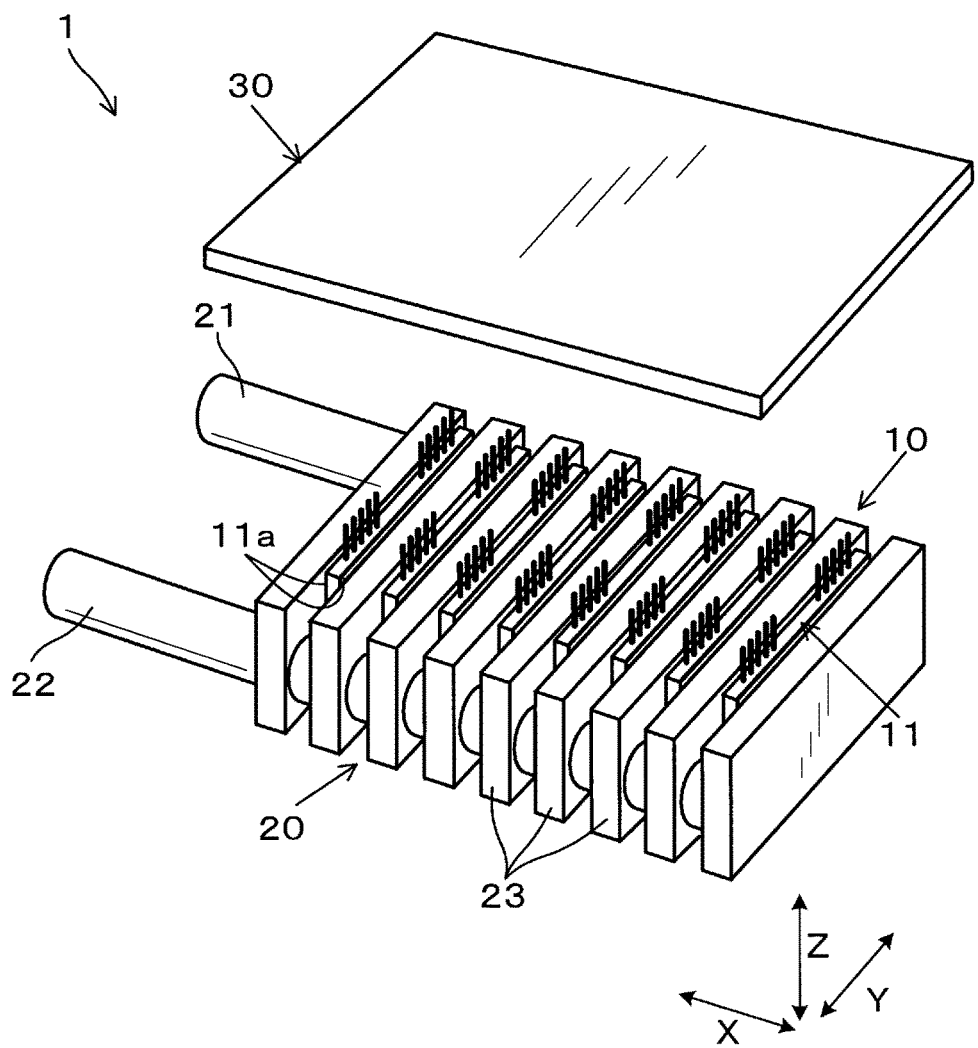
FIG. 2 shows a perspective view of the electric power converter of FIG. 1.

As shown in FIG. 1 and FIG. 2, an electric power converter 1 of the first embodiment includes a plurality of components including a laminated semiconductor unit 10 and a control circuit board 30.

These components are accommodated in a space partitioned by a case 1a.

The case 1a is an automobile component that requires lightweight and high dimensional accuracy, and is manufactured by an aluminum-die-casting method using aluminum.

The laminated semiconductor unit 10 includes a plurality of semiconductor modules 11 and a cooler 20 for cooling these semiconductor modules 11.

The cooler 20 includes an inflow pipe (inflow header) 21 extending in the first direction X and an outflow pipe (outflow header) 22 extending in the first direction X, and a plurality of cooling pipes 23, each of which extending in the second direction Y, arranged at a predetermined interval in the first direction X.

In the laminated semiconductor unit 10, the plurality of semiconductor modules 11 and the plurality of cooling pipes 23 are laminated alternately in the first direction X.

In this case, each of the semiconductor modules 11 has two outer surfaces 11a, 11a extending in parallel to each other, and each of the cooling pipes 23 is disposed so as to be in contact with each of the two outer surfaces 11a, 11a of the semiconductor module 11.

That is, each semiconductor module 11 is sandwiched by two cooling pipes 23, 23 from both sides.

Note that this laminated semiconductor unit 10 can also be referred to as an electric power converter or a semiconductor module.

A plurality of control terminals (a plurality of control terminals 14a, 15a to be described later) of the semiconductor module 11 are all connected to the control circuit board 30.

A control current for controlling a switching operation of a semiconductor element of the semiconductor module 11 is inputted from the control circuit board 30 to the semiconductor module 11 through these control terminals.

In the cooler 20, respective inflow portions of the plurality of cooling pipes 23 are connected to the inflow pipe 21, and respective outflow portions of the plurality of cooling pipes 23 are connected to the outflow pipe 22.

Further, each of the cooling pipes 23 has a refrigerant passage 24 in the pipe.

Therefore, when a refrigerant flowing into the inflow portions of the cooling pipes 23 from the inlet pipe 21 flows through the refrigerant passages 24 in the cooling pipes 23 cools the semiconductor module 11 that is in contact with the cooling pipes 23, and then discharged from the cooling pipes 23 to the outflow pipe 22.

The cooler 20 is composed of a material having excellent thermal conductivity such as aluminum.

As a refrigerant flowing into the refrigerant passage 24 of the cooling pipe 23, for example, water mixed with ethylene glycol-based antifreeze, natural cooling medium such as water or ammonia, fluorocarbon cooling medium such as FLUORINERT™, HCFC123, fluorocarbon cooling medium such as HFC134a, alcohol-based cooling medium such as methanol or alcohol, ketone-based cooling medium such as acetone may be optionally used.

Figure 3:
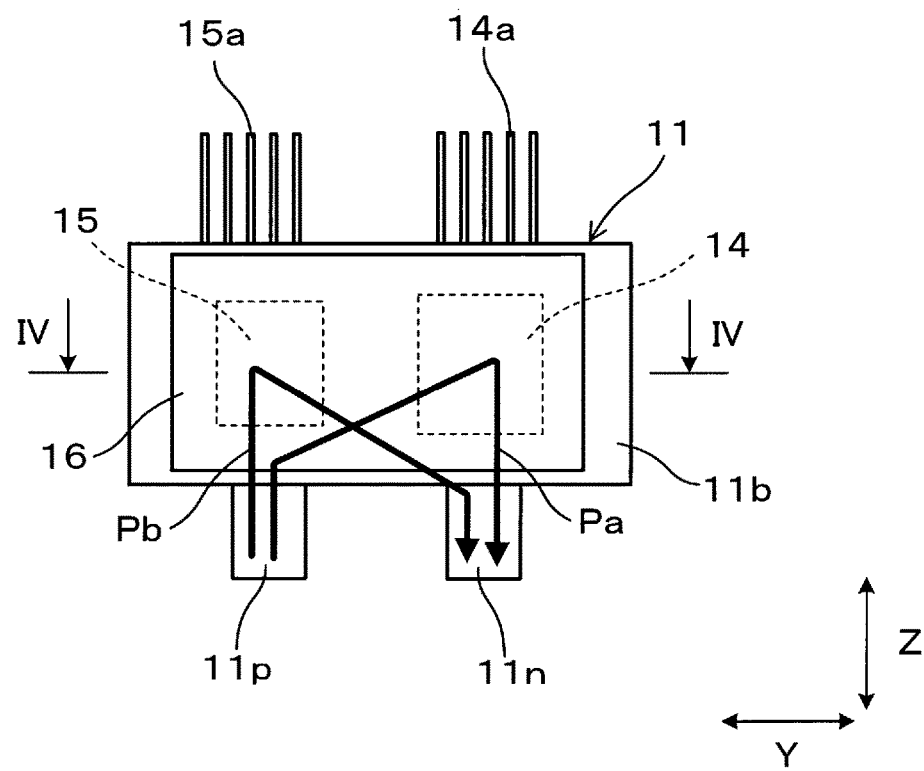
FIG. 3 is a side view of the semiconductor module of FIG. 1 in a thickness direction.
Figure 4:
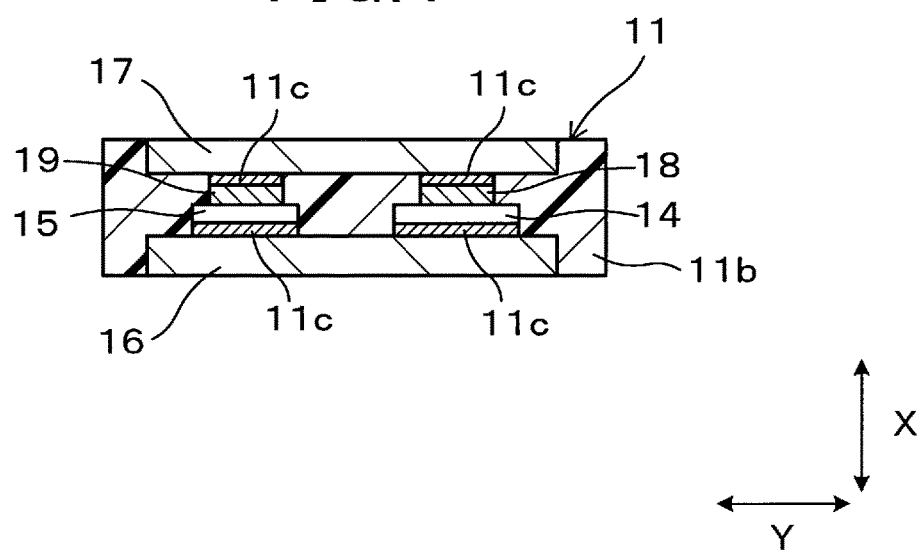
FIG. 4 shows a sectional view taken along a line IV-IV of FIG. 3.

As shown in FIG. 3 and FIG. 4, the semiconductor module 11 is provided with an IGBT (Insulated Gate Bipolar Transistor) 14, a MOSFET (Metal-Oxide-Semiconductor Field-Effect Transistor) 15, and a lead frame 16.

This semiconductor module 11 is provided with one semiconductor element pair composed of the IGBT 14 and the MOSFET 15, and is referred to as "1 in 1 module".

Both the IGBT 14 and the MOSFET 15 are switching elements.

In the present embodiment, the IGBT 14 is an insulated gate bipolar transistor formed of a Si (silicon) based material, and the MOSFET 15 is a field effect transistor formed of a wide band-gap semiconductor.

The IGBT 14 is excellent in large current characteristics and inexpensive as compared with the MOSFET 15.

The MOSFET 15 is excellent in low current characteristics and high-speed switching characteristics.

Note that it is preferable to use a wide band-gap semiconductor element composed of SiC (silicon carbide) based material, GaN (gallium nitride) based material, or the like as the MOSFET 15 formed of a wide band-gap semiconductor.

As shown in FIG. 4, the semiconductor module 11 is molded with a mold resin 11b.

One of element surfaces of the IGBT 14 is joined to the lead frame 16 via a solder layer 11c and another one of element surfaces is joined to a terminal 18 joined to another lead frame 17 via another solder layer 11c.

One of element surfaces of the MOSFET 15 is joined to the lead frame 16 via the solder layer 11c and another one of element surfaces is joined to another terminal 19 joined to the lead frame 17 via the other solder layer 11c.

The lead frames 16 and 17 support and fix both the IGBT 14 and the MOSFET 15, and constitute an input/output terminal for inputting from the outside and outputting to the outside.

These lead frames 16, 17 are composed of a thin plate of a metal material such as a Cu alloy material, an iron alloy material, or other metal material excellent in mechanical strength, electric conductivity, thermal conductivity, corrosion resistance and the like.

The semiconductor module 11 has a P terminal 11$p$, which is a first terminal, and an N terminal 11$n$, which is a second terminal, as power terminals extending in parallel with each other from the lead frames 16 and 17.

The P terminal 11$p$ extends from the lead frame 16 along the third direction Z, and the N terminal 11$n$ extends from the lead frame 17 along the third direction Z.

DC voltage is applied to the semiconductor module 11 via the P terminal 11$p$ and the N terminal 11$n$.

In the semiconductor module 11 of the present embodiment, the IGBT 14 and the MOSFET 15 are provided on the same lead frame 16.

Alternatively, it can be said that the IGBT 14 and the MOSFET 15 are provided on the same lead frame 17.

In the semiconductor module 11, the control terminals 14$a$ of the IGBT 14 and the control terminals 15$a$ of the MOSFET 15 are respectively connected to the control circuit board 30.

The IGBT 14 and the MOSFET 15 of the semiconductor module 11 are arranged side by side in a direction (second direction Y) intersecting with an extending direction of the P terminal 11$p$ and the N terminal 11$n$ (the third direction Z).

Further, either one of the IGBT 14 and the MOSFET 15 is a first switching element and the remaining one is a second switching element, and when the semiconductor module 11 is viewed from a thickness direction (first direction X) of the element, it is constituted so that the second switching element is disposed at a position that is separated from a conduction path of the first switching element in the same lead frame 16.

Specifically, when the semiconductor module 11 is viewed from the thickness direction of the element, the MOSFET 15 as the second switching element is disposed at a position that is separated from the conduction path Pa (a position not overlapping with each other) of the IGBT 14 as the first switching element.

That is, the MOSFET 15 is not disposed on the conduction path Pa of the IGBT 14.

On the other hand, when the semiconductor module 11 is viewed from the thickness direction of the element, the IGBT is disposed at a position that is separated from the conduction path Pb of the MOSFET 15 (a position not overlapping with each other).

That is, the IGBT 14 is not disposed on the conduction path Pb of the MOSFET 15.

Here, the conduction path Pa is a conduction path formed between the P terminal 11$p$ and the N terminal 11$n$ via the IGBT 14, and is a region in which a current substantially flows for driving the IGBT 14.

Further, the conduction path Pb is a conduction path formed between the P terminal 11$p$ and the N terminal 11$n$ via the MOSFET 15, and is a region in which a current substantially flows for driving the MOSFET 15.

The semiconductor module 11 is configured such that the length of the conduction path Pa of the IGBT 14 is shorter than the length of the conduction path Pb of the MOSFET 15.

In this case, an inductance of the shorter conduction path Pa is smaller than an inductance of the other conduction path Pb.

Figure 5:
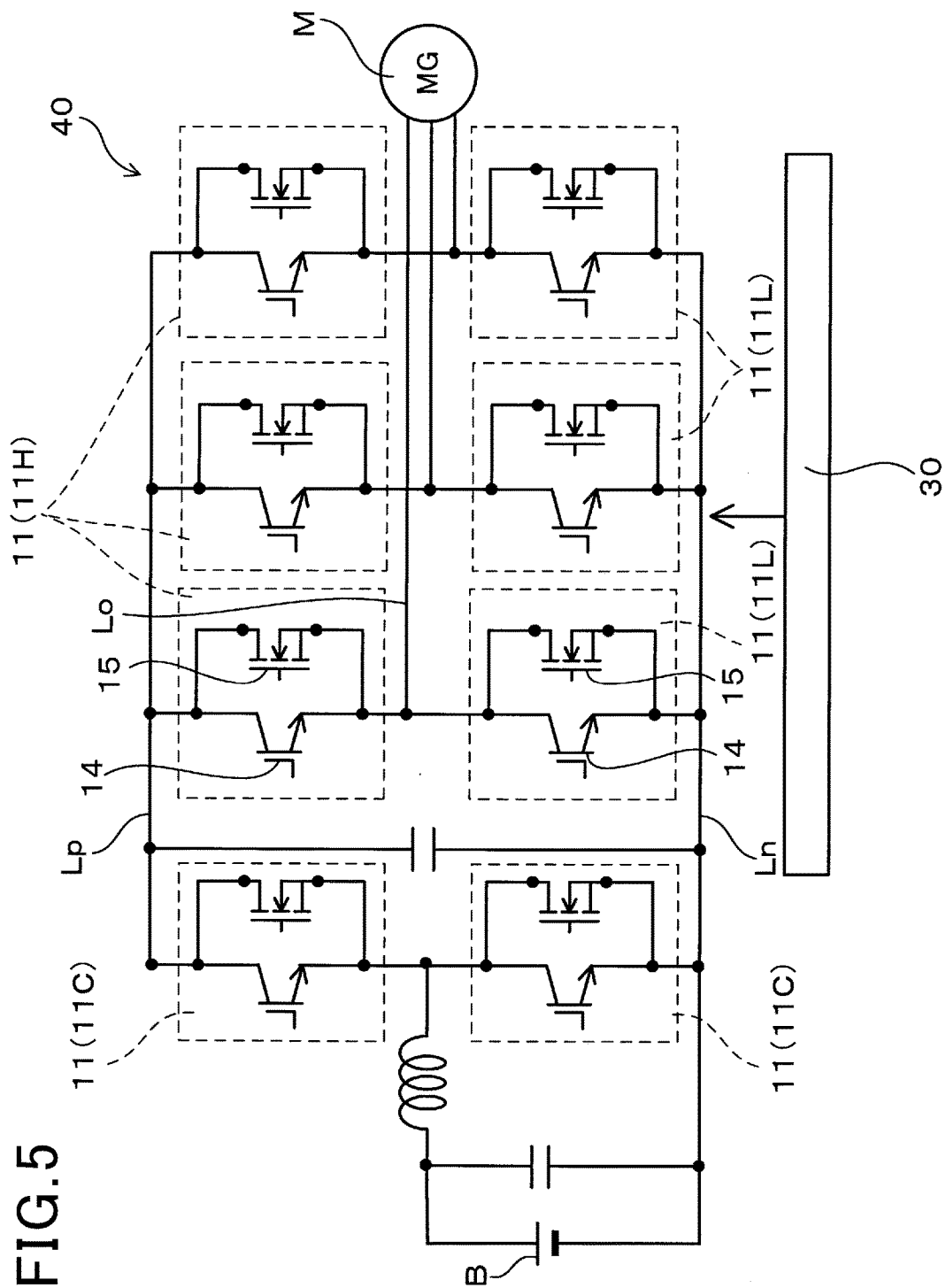
FIG. 5 shows an inverter circuit diagram of the electric power converter of FIG. 1.

As shown in FIG. 5, an inverter circuit 40 of the electric power converter 1 is configured by using a plurality (eight in FIG. 5) of semiconductor modules 11.

The eight semiconductor modules 11 are classified into two modules 11C, 11C constituting a booster circuit for boosting the voltage of the power supply B and six modules constituting a conversion circuit for converting boosted DC power to AC power.

The six modules of the conversion circuit are further classified into three upper arm modules 11H connected to a high potential side line Lp of the power supply B and three lower arm modules 11L connected to a low potential side line Ln of the power supply B.

Figure 6:
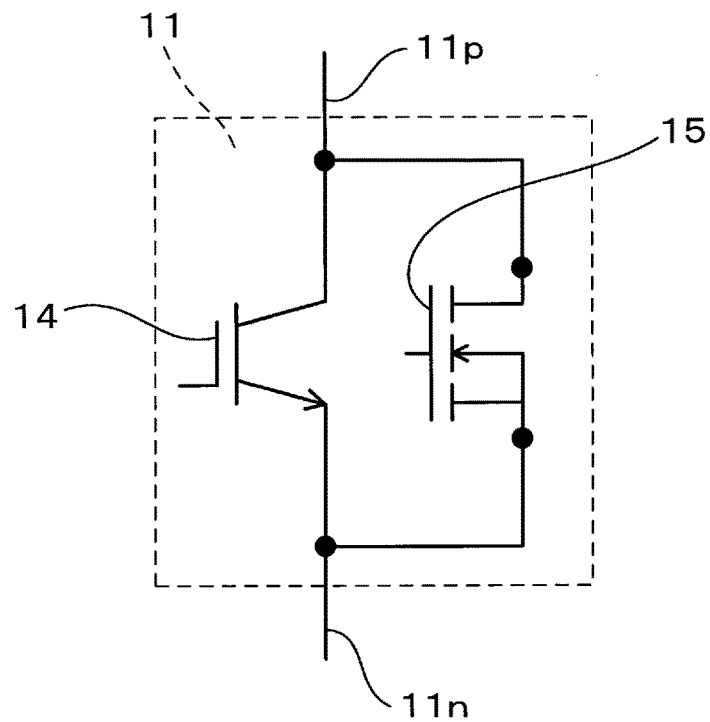
FIG. 6 shows an equivalent circuit diagram of the semiconductor module of FIG. 5.

As reference is made to an equivalent circuit of FIG. 6, the IGBT 14 and the MOSFET 15 are connected in parallel to each other in the semiconductor module 11.

More specifically, a collector of the IGBT 14 and a drain of the MOSFET 15 are connected, and an emitter of the IGBT 14 and a source of the MOSFET 15 are connected.

A gate of the IGBT 14 and a gate of the MOSFET 15 are connected to the control circuit board 30.

A three-phase AC motor M for driving the vehicle is driven by AC power obtained by the inverter circuit 40.

Figure 7:
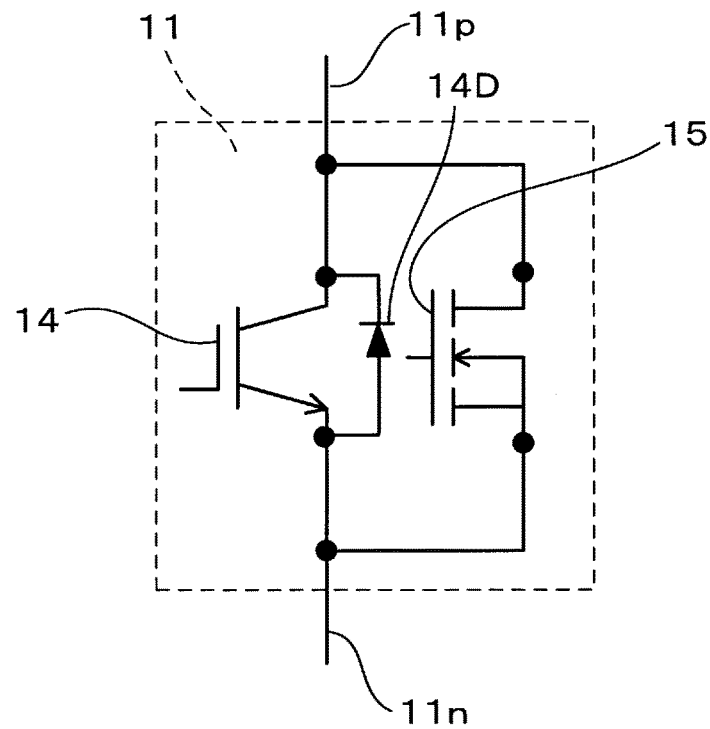
FIG. 7 shows a modification of the equivalent circuit of FIG. 6.

The equivalent circuit may adopt a structure composed of the IGBT 14 and an FWD (Free Wheeling Diode) for reflux being the same or separate elements (refer to an FWD 14D shown in FIG. 7), or a body diode of the MOSFET 15 or a synchronous rectification may also be adopted.

Figure 8:
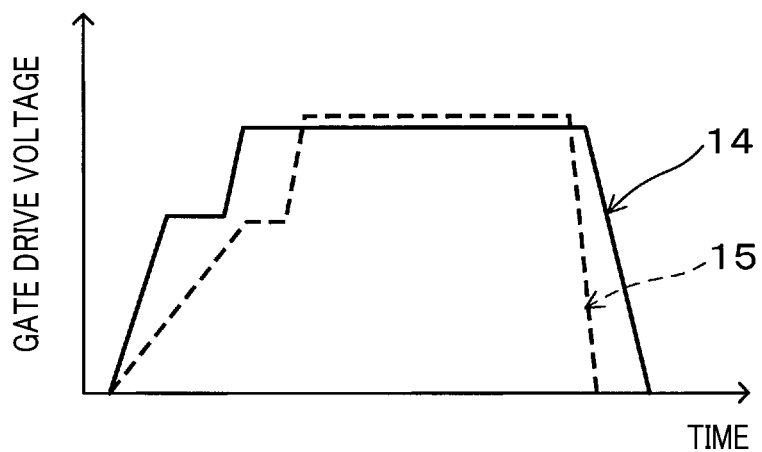
FIG. 8 shows a diagram for explaining a switching control.

As shown in FIG. 8, in the semiconductor module 11 of the present embodiment, the control circuit board 30 controls so that the IGBT 14 is driven (turned on) prior to the MOSFET 15 and the IGBT 14 is turned off after the MOSFET 15 is turned off.

That is, when the MOSFET 15 switches, the IGBT 14 is always turned on.

In this case, the IGBT 14 becomes an element that mainly performs the switching operation (hereinafter also referred to as a main element), and the MOSFET 15 becomes an element that supports or assists the IGBT 14 (hereinafter also referred to as a sub element).

Figure 9:
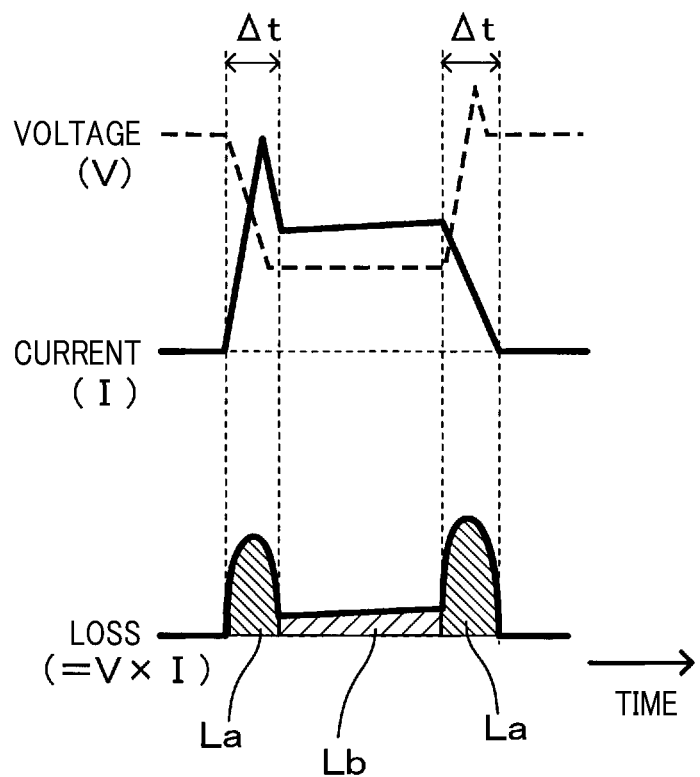
FIG. 9 is a diagram for explaining a loss of the semiconductor element.

According to such a control, as shown in FIG. 9, the MOSFET 15 can be switched in a state where the IGBT 14 is turned on and the voltage (on-voltage) applied to the MOSFET 15 is lowered.

Therefore, although the switching loss La occurs in the IGBT 14, the switching loss La does not occur in the MOSFET 15.

As a result, the switching loss La is borne by the IGBT 14, and the conduction loss Lb is shared by both the IGBT 14 and the MOSFET 15.

In this case, the burden on the MOSFET 15 can be reduced, and the element size of the MOSFET 15 can be reduced accordingly.

Further, since it is known that the resistance of the MOSFET 15 is lower than the resistance of the IGBT 14 at the time of low current which is an operating point where the influence on fuel consumption (also called electricity cost) is large, and current flows easily to the MOSFET 15, it is effective for improving fuel economy.

Here, a switching loss La is a loss (product of voltage and current) at the switching time Δt of the switching element.

On the other hand, a conduction loss Lb is a loss (product of voltage and current) in the ON period excluding the switching time Δt of the switching element.

Further, as described above, since the current path Pa of the main element IGBT 14 is shorter than the current path Pb of the sub-element MOSFET 15 and thus the inductance becomes smaller in the present embodiment, the switching loss by the IGBT 14 can be kept low and the element size of the IGBT 14 can be reduced.

Incidentally, in the control mentioned above, if the switching speed is increased when the IGBT 14 is switched from OFF to ON (ON switching), a time rate of change di/dt of a main current i increases and a high induced current is likely to occur.

Therefore, the semiconductor module 11 of the present embodiment is preferably configured so that, at this time, the induced current flows in a direction to turn off the MOSFET 15.

According to the present configuration, even if a high induced current flows, the MOSFET 15 is not turned on.

Therefore, it is possible to suppress the switching loss La of the MOSFET 15 from increasing by turning on the MOSFET 15 simultaneously with the IGBT 14.

In addition, when the IGBT 14 is switched from ON to OFF, an induction current occurs at the control terminal 15a of the MOSFET 15 in the same manner as when turning on the IGBT 14.

The induced current flows in a direction opposite to a direction when the IGBT 14 is turned on (at the time of high-speed switching).

That is, the induced current flows in the direction to turn on the MOSFET 15.

Therefore, when turning off the IGBT 14, the semiconductor module 11 of the present embodiment is preferably configured to slow down the switching speed of the IGBT 14.

According to the present configuration, the induced current occurring when the IGBT 14 is turned off can be reduced, and the MOSFET 15 can be suppressed from being turned on.

Figure 10:
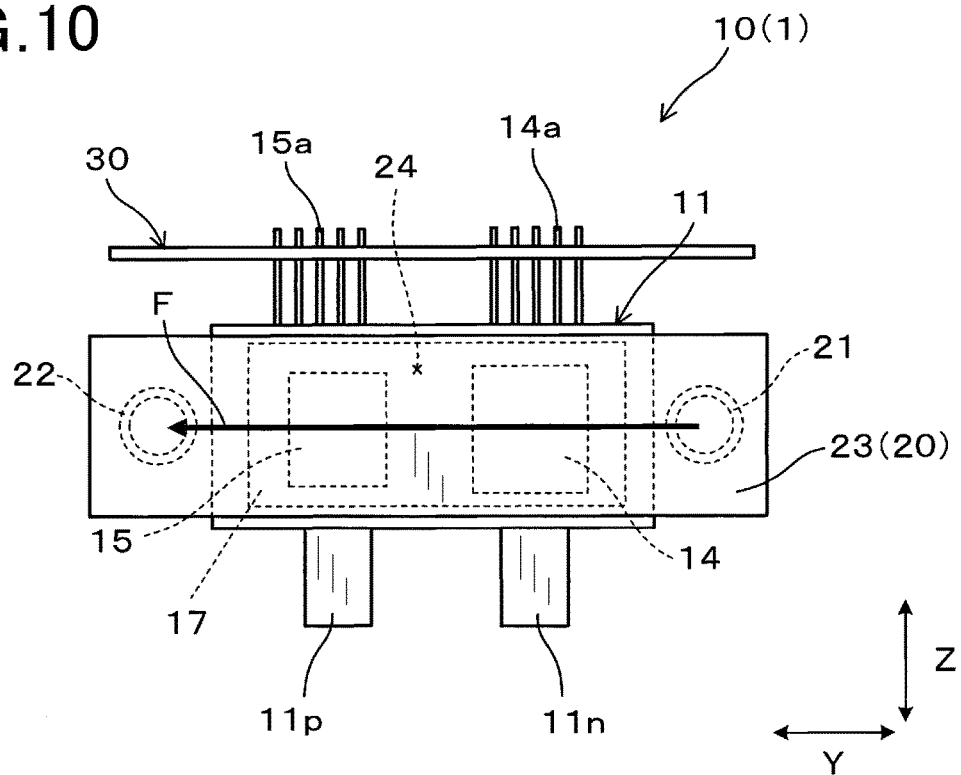
FIG. 10 shows a side view indicating a relationship between the semiconductor module of FIG. 5 and a flow of a refrigerant in a refrigerant passage of a cooler.

As shown in FIG. 10, the cooling pipes 23 of the cooler are indirectly in touch with the lead frames 16, 17 constituting the outer surfaces 11a, 11a of the semiconductor module 11 via insulators (not shown).

The outer surfaces 11a, 11a of the semiconductor module 11 form heat radiation surfaces, and surfaces of the cooling pipes 23 form heat receiving surfaces.

In this case, the refrigerant passage 24 of the cooling pipe 23 is arranged so as to extend facing the lead frames 16, 17.

Then, the semiconductor module 11 is configured such that the first-driven IGBT 14 is disposed on an upstream side of the MOSFET 15 with respect to a flow F of the refrigerant in the refrigerant passage 24 of the cooler 20.

In other words, the semiconductor module 11 is configured such that the first-driven IGBT 14 is not disposed on the downstream side of the MOSFET 15 with respect to the flow F of the refrigerant in the refrigerant passage 24 of the cooler 20.

The present configuration is achieved by appropriately adjusting the arrangement relationship of the IGBT 14 and the MOSFET 15 in the semiconductor module 11, the arrangement of the refrigerant passage 24 in the cooler 20, and the like.

According to the present configuration, since the IGBT 14 is cooled before the MOSFET 15 and the IGBT 14 is not cooled after the MOSFET 15 is, the cooling of the IGBT 14 can be improved.

Next, functions and effects of the electric power converter 1 of the first embodiment will be described.

According to the electric power converter 1, since one of the switching elements is not disposed on the conduction path of the other one of the switching elements of the semiconductor module 11, the MOSFET 15 is less likely to receive thermal influence generated in the conduction path Pa of the IGBT 14 when the IGBT 14 is driven.

Similarly, the IGBT 14 is less likely to receive thermal influence generated in the conduction path Pb of the MOSFET 15 when the MOSFET 15 is driven.

That is, it is possible to suppress the mutual thermal influence between the two switching elements, the IGBT 14 and the MOSFET 15.

In addition, by suppressing this thermal influence, the performance of each of the IGBT 14 and the MOSFET 15 is improved, and the element size of each switching element can be reduced accordingly.

According to the above-described electric power converter 1, since the first-driven IGBT 14 is cooled before the MOSFET 15, the performance of the IGBT 14 can be kept high and the element size of the IGBT 14 can be reduced by that much.

Figure 11:
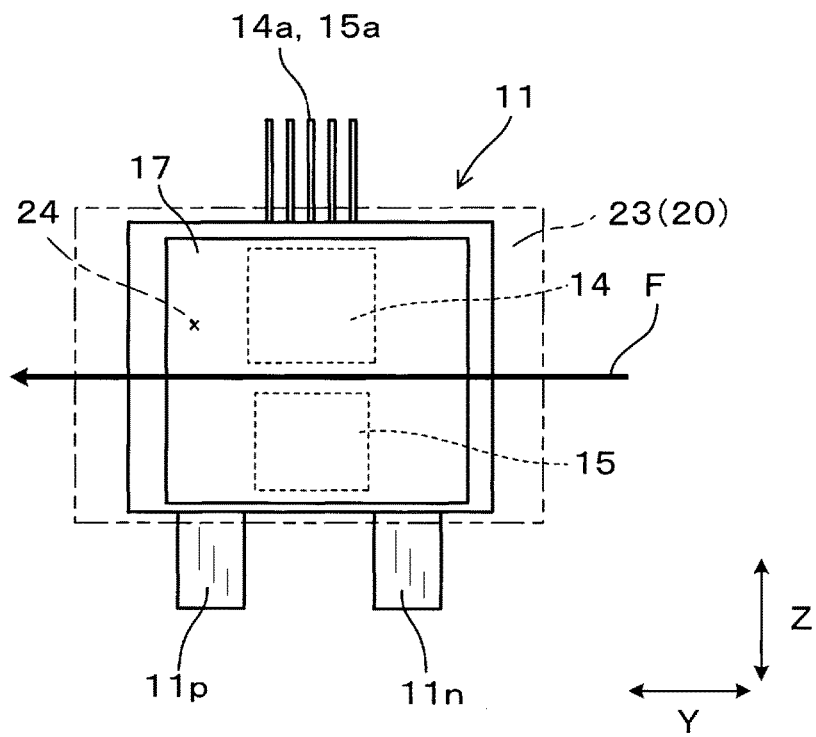
FIG. 11 shows a modification of FIG. 10.
Figure 12:
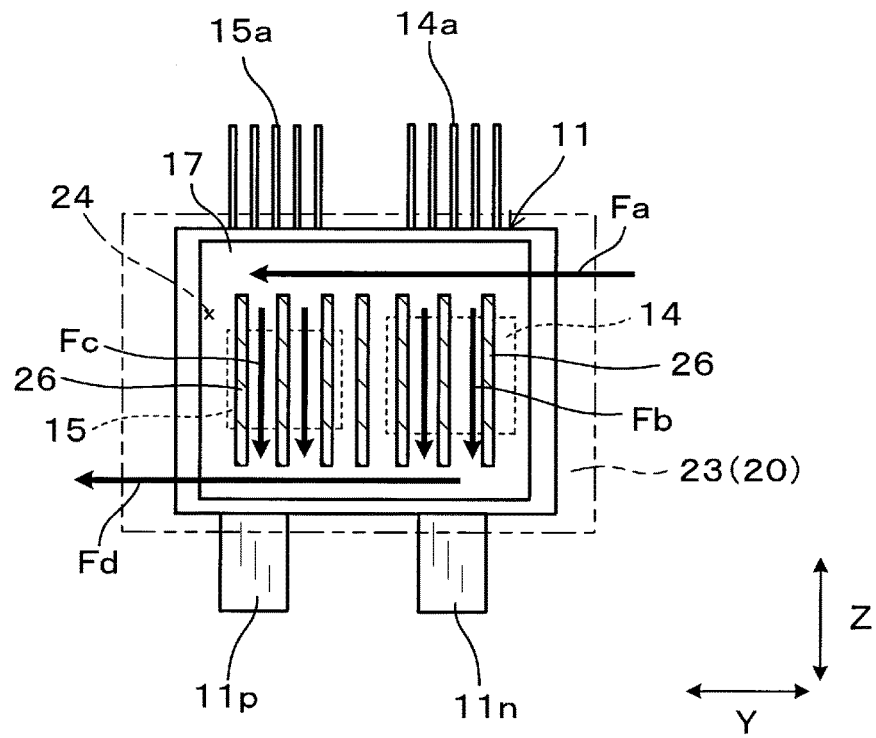
FIG. 12 shows another modification of FIG. 10.

In connection with the arrangement of the switching elements (IGBT 14, MOSFET 15) as shown in FIG. 10, it is possible to adopt arrangements of the switching elements as shown in FIGS. 11 and 12.

The semiconductor module 11 shown in FIG. 11 is configured such that the IGBT 14 is disposed at the same position as the MOSFET 15 with respect to the flow F of the refrigerant in the refrigerant passage 24 of the cooler 20.

Even in this case, similarly to the case of FIG. 10, the first-driven IGBT 14 is not disposed on downstream side of the MOSFET 15 with respect to the flow F of the refrigerant in the refrigerant passage 24 of the cooler 20.

Further, in the semiconductor module 11 shown in FIG. 12, the cooling pipe 23 of the cooler 20 is configured such that four different refrigerant flows Fa, Fb, Fc, and Fd are formed in the refrigerant passage 24.

In the refrigerant passage 24, the flow Fa of the refrigerant flowing into the cooling pipe 23 branches into two flows Fb and Fc, then flows in parallel to the MOSFET 15 and the IGBT 14, and then becomes the flow Fd of the merged refrigerant and flows out from the cooling pipe 23.

Such flows are formed by a plurality of radiating fins 26 provided in the refrigerant passage 24 of the cooling pipe 23.

Each of the plurality of radiating fins 26 is configured to extend in parallel in the third direction Z, and has an effect to improve the cooling capacity by increasing contact areas with the refrigerant to enhance the heat exchange efficiency effectively.

In this case as well, as in the case of FIG. 10, the first-driven IGBT 14 is not disposed on the downstream side of the MOSFET 15 with respect to the refrigerant flows Fa, Fb, Fc, Fd in the refrigerant passage 24 of the cooler 20.

Therefore, also in the case of the arrangement of the switching elements as shown in FIGS. 11 and 12, cooling of the IGBT 14 can be improved because the IGBT 14 to be driven earlier is not cooled after the MOSFET 15.

Second Embodiment

It should be appreciated that, in the second embodiment, components identical with or similar to those in the first embodiment are given the same reference numerals, and repeated structures and features thereof will not be described in order to avoid redundant explanation.

An electric power converter 2 of the second embodiment is different from the electric power converter 1 of the first embodiment in the number of semiconductor element pairs composed of an IGBT 14 and a MOSFET 15.

That is, a semiconductor module 111 of the electric power converter 2 is provided with two semiconductor element pairs composed of the IGBT 14 and the MOSFET 15.

This semiconductor module 111 is provided with two semiconductor element pairs in which the IGBT 14 and the MOSFET 15 are connected in parallel to each other, and these two semiconductor element pairs are connected in series and are disposed between a high potential side line Lp and a low potential side line Ln of a power supply B.

This semiconductor module 111 is referred to as "2 in 1 module".

This semiconductor module 111 has a configuration in which a single upper arm module 11H and a single lower arm module 11L in FIG. 5 are combined.

Note that a semiconductor module having three or more semiconductor element pairs can also be adopted as necessary.

Other configurations are the same as those in the first embodiment.

Figure 13:
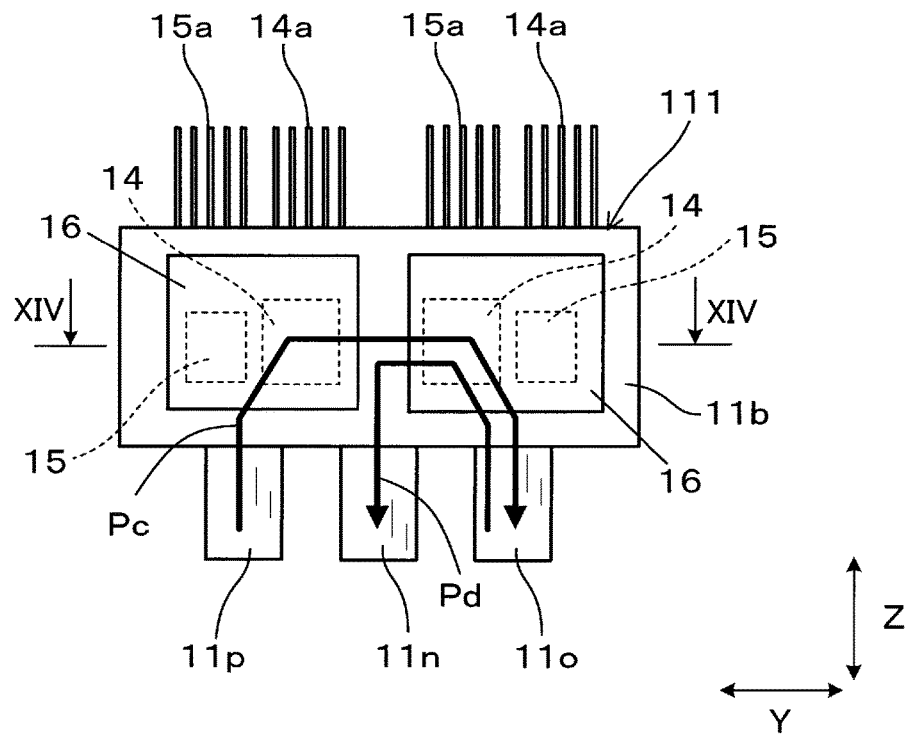
FIG. 13 is a side view of a semiconductor module in a thickness direction in an electric power converter according to a second embodiment.
Figure 15:
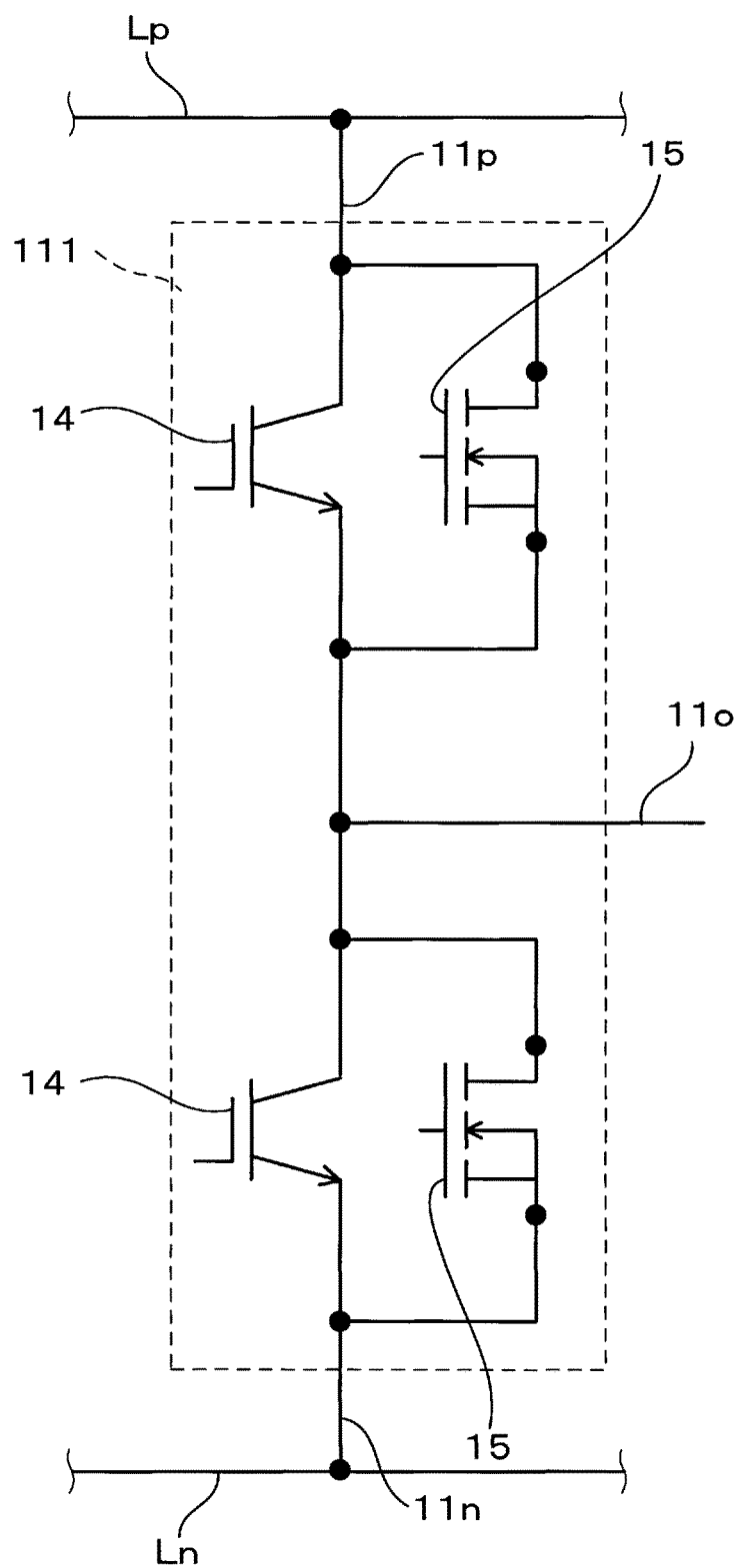
FIG. 15 is an equivalent circuit diagram of the semiconductor module of FIG. 13.

As shown in FIGS. 13 and 15, the semiconductor module 111 is provided with a P terminal 11p, an N terminal 11n, and an O terminal 11o as power terminals.

The DC voltage is applied to the semiconductor module 111 via the P terminal 11p and the N terminal 11n, and the AC power is output from the semiconductor module 111 through the O terminal 11o.

Figure 16:
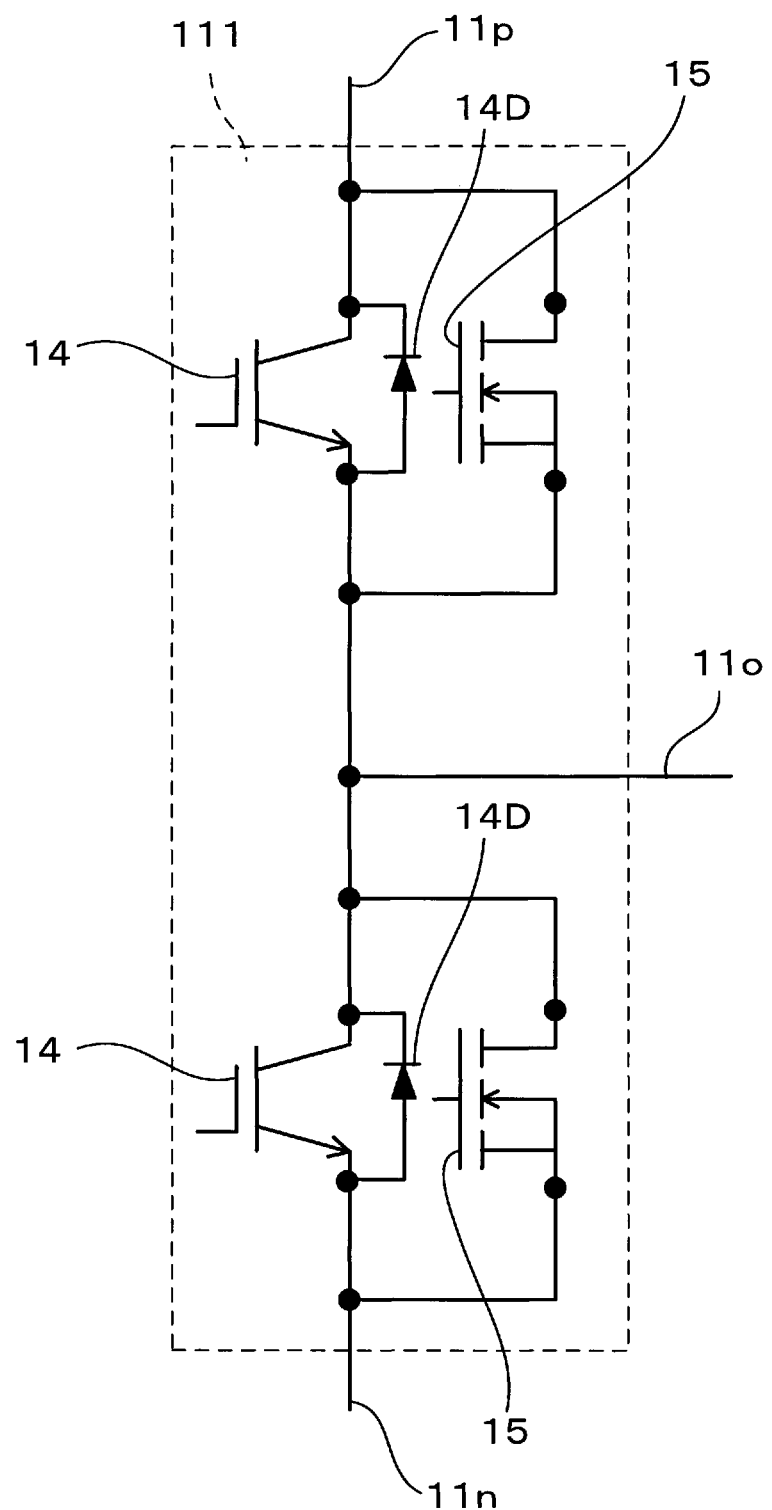
FIG. 16 shows a modification of the equivalent circuit of FIG. 15.

An equivalent circuit shown in FIG. 15 may adopt a structure composed of the IGBT 14 and an FWD (Free Wheeling Diode) for reflux being the same or separate elements (refer to an FWD 14D shown in FIG. 16), or a body diode of the MOSFET 15 or a synchronous rectification may also be adopted.

Figure 14:
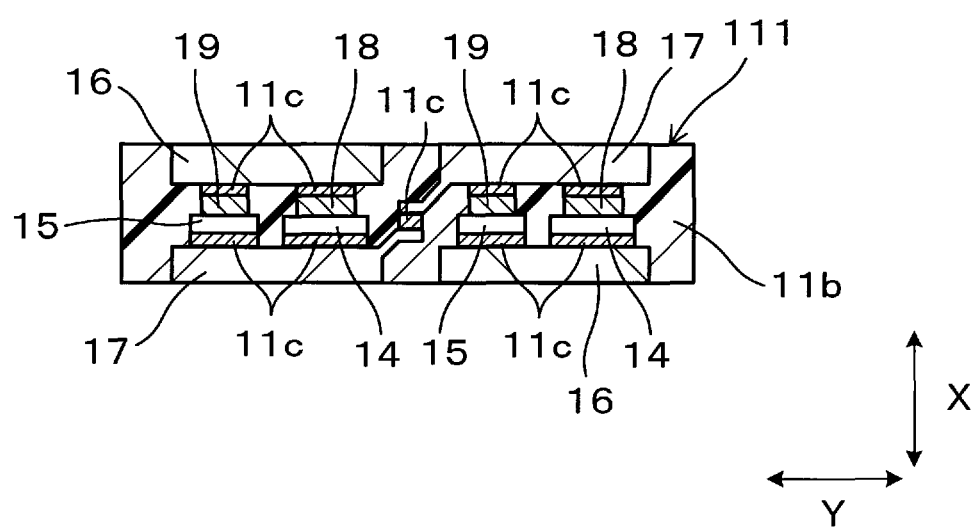
FIG. 14 is a sectional view taken along a line XIV-XIV of FIG. 13.

As shown in FIG. 14, the semiconductor module 111 is molded with the same mold resin 11b as the semiconductor module 11.

One of element surfaces of the left IGBT 14 in FIG. 14 is joined to a lead frame 17 via a solder layer 11c.

In addition, another one of element surfaces of the IGBT 14 is joined to a terminal 18 joined to a lead frame 16 via another solder layer 11c.

One of element surfaces of the right side IGBT 14 in FIG. 14 is joined to another lead frame 16 via the solder layer 11c.

In addition, another one of element surfaces of the IGBT 14 is joined to another terminal 18 joined to another lead frame 17 via another solder layer 11c.

The lead frames 17 consisting of two frames are integrated via another solder layer 11c.

One of element surfaces of the left side MOSFET 15 in FIG. 14 is joined to the lead frame 17 via a solder layer 11c.

In addition, another one of element surfaces of the IGBT 15 is joined to a terminal 19 joined to the lead frame 16 via another solder layer 11c.

One element surfaces of the right side MOSFET 15 in FIG. 14 is joined to another lead frame 16 via another solder layer 11c.

In addition, another one of element surfaces of the MOSFET 15 is joined to another terminal 19 joined to the lead frame 17 via another solder layer 11c.

In the semiconductor module 111, the P terminal 11p extends from one of the lead frames 16 along the third direction Z, and the N terminal 11n extends from another one of the lead frames 16 along the third direction Z.

In the semiconductor module 111 of the present embodiment, the IGBT 14 and the MOSFET 15 of one semiconductor element pair are disposed on the same lead frame 16, and the IGBT 14 and the MOSFET 15 of the other semiconductor element pair are disposed on the same lead frame 17.

The semiconductor module 111 is controlled by the control circuit board 30 so that the two IGBTs 14, 14 included in the two semiconductor element pairs are driven prior to the two MOSFETs 15, 15.

The semiconductor module 111 is arranged side by side in the direction (second direction Y) in which the two IGBTs 14, and the two MOSFETs 15, 15 intersecting with the extending direction of the P terminal 11 p, the N terminal 11 n, and the O terminal 11o (third direction Z).

Specifically, the MOSFET 15, the IGBT 14, the IGBT 14, and the MOSFET 15 are arranged in order from the left in FIG. 13.

When viewing the module from the thickness direction of the element (the first direction X), regarding a semiconductor element disposed between the high potential side line Lp and the AC output line Lo among the two semiconductor element pairs, the semiconductor module 111 is configured such that the MOSFET 15 is disposed at a position (a position not overlapping each other) not in the conduction path Pc formed between the high potential side line Lp and the AC output line Lo via the IGBT 14.

This conduction path Pc is a conduction path formed between the P terminal 11p and the O terminal 11o via the IGBT 14.

In the present embodiment, the MOSFET 15 is disposed at a position separated from the conduction path Pc of the first-driven IGBT 14.

That is, the MOSFET 15 is not disposed on the conduction path Pc of the IGBT 14.

Similarly, when viewing the module from the thickness direction of the element (the first direction X), regarding a semiconductor element disposed between the low potential side line Ln and the AC output line Lo among the two semiconductor element pairs, the semiconductor module 111 is configured such that the MOSFET 15 is disposed at a position (a position not overlapping each other) not in the conduction path Pd formed between the high potential side line Lp and the AC output line Lo via the IGBT 14.

This conduction path Pd is a conduction path formed between the N terminal 11n and the O terminal 11o via the IGBT 14.

In the present embodiment, the MOSFET 15 is disposed at a position separated from the conduction path Pd of the first-driven IGBT 14.

That is, the MOSFET 15 is not disposed on the conduction path Pd of the IGBT 14.

In addition, the semiconductor module 111 is configured such that the length of the conduction paths of two first-driven IGBTs 14, 14 (conduction paths formed between the high potential side line Lp and the low potential side line Ln sequentially passes through the two IGBTs 14, 14) is shorter than the conduction paths of the two MOSFETs 15, 15 (conduction paths formed between the high potential side line Lp and the low potential side line Ln sequentially passes through the two MOSFETs 15, 15).

In this case, the inductance of the conduction path having a relatively short length is smaller than the inductance of the conduction path having a relatively long length.

Figure 17:
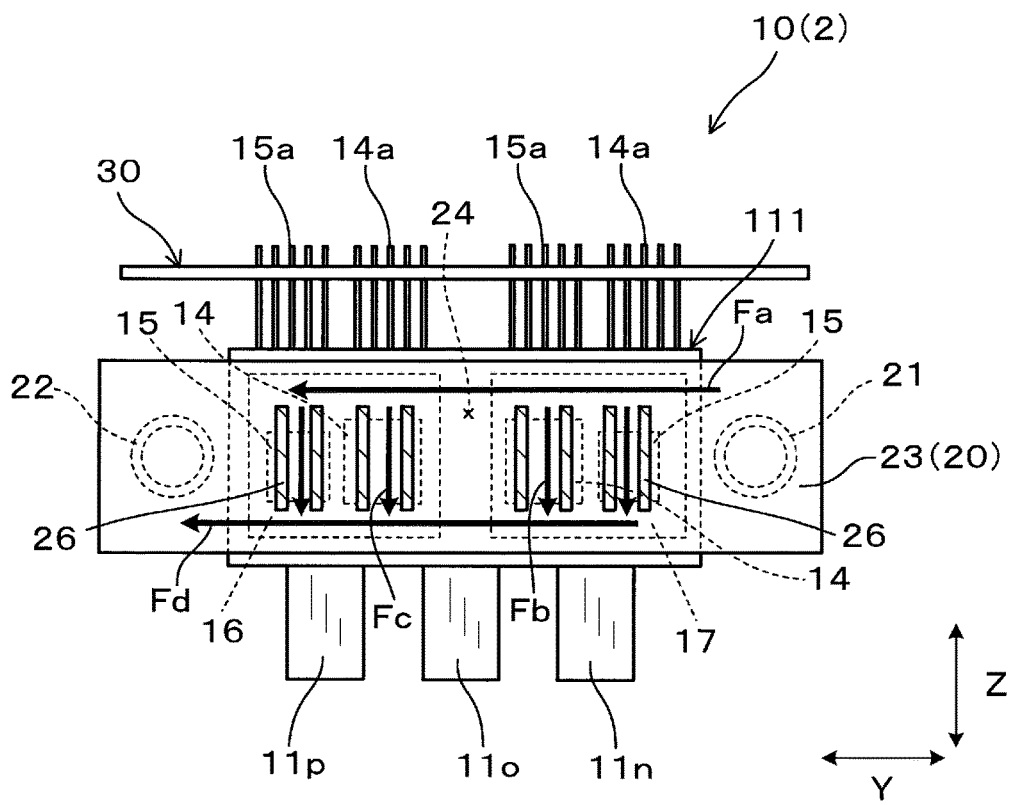
FIG. 17 shows a side view indicating a relationship between the semiconductor module of FIG. 13 and a flow of a refrigerant in a refrigerant passage of a cooler.

As shown in FIG. 17, the semiconductor module 111 is configured such that, in the same lead frame 16 or 17, the IGBT 14, that is driven first in each of the two semiconductor element pairs, is not arranged on the downstream side of the MOSFET 15 with respect to the flow of the refrigerant F in the refrigerant passage 24 of the cooler 20.

Specifically, the cooling pipe 23 of the cooler 20 is configured so that four different refrigerant flows Fa, Fb, Fc, and Fd are formed in the refrigerant passage 24.

In the refrigerant passage 24, the flow Fa of the refrigerant flowing into the cooling pipe 23 branches into two flows Fb and Fc, then flows in parallel to the two semiconductor element pairs, and then becomes the flow Fd of the merged refrigerant and flows out from the cooling pipe 23.

Such flows are formed by providing a plurality of radiating fins 26 similar to the above-described radiating fins 26 (refer to FIG. 12) in the refrigerant passage 24 of the cooling pipe 23.

At this time, the IGBT 14 and the MOSFET 15 of one semiconductor element pair are cooled at the same timing by the flow Fb of the refrigerant.

Further, the IGBT 14 and the MOSFET 15 of the other semiconductor element pair are cooled at the same timing by the flow Fb of the refrigerant.

Therefore, the first-driven IGBT 14 is not cooled after the MOSFET 15 is, and the cooling of the IGBT 14 can be improved.

Next, functions and effects of the electric power converter 2 of the second embodiment will be described.

According to the electric power converter 2, since the MOSFET 15 is not disposed on the conduction path Pc of the first-driven IGBT 14 in the semiconductor module 111, the influence of heat generated in the conduction path Pc is hardly received by the MOSFET 15.

Similarly, since the MOSFET 15 is not disposed on the conduction path Pd of the first-driven IGBT 14, the influence of heat generated in the conduction path Pc is hardly received by the MOSFET 15.

Further, since the conduction path formed between the high-potential side line Lp and the low-potential side line Ln sequentially passes through the two IGBTs 14, 14, which are main elements, is shorter and the inductance is smaller as compared with the conduction path formed between the high potential side line Lp and the low potential side line Ln sequentially passes through the two MOSFETs 15, 15 which are the sub elements, the switching loss by the IGBT 14 can be kept low, and the element size of the IGBT 14 can be made small.

It should be noted that a configuration in which two MOSFETs 15, 15 included in the two pairs of semiconductor elements are driven prior to the two IGBTs 14, 14 may be adopted as necessary.

In this case, it is preferable that the IGBT 14 is disposed at the position deviating from the conduction path of the first-driven MOSFET 15 (the conduction path formed between the P terminal 11p and the O terminal 11o or the conduction path formed between the N terminal 11n and the O terminal 11o) d.

As a result, the IGBT 14 is less likely to be thermally influenced by heat generated in the conduction path of the MOSFET 15.

In this case, it is further preferable that the length of the conduction paths of the two first-driven MOSFETs 15, 15 (conduction paths formed between the high potential side line Lp and the low potential side line Ln sequentially passes through the two MOSFETs 15, 15) is configured shorter than the length of the conduction paths of the two IGBTs 14, 14 (conduction paths formed between the high potential side line Lp and the low potential side line Ln sequentially passes through the two IGBTs 14, 14).

As a result, the switching loss by the MOSFET 15 can be kept low, and the element size of the MOSFET 15 can be reduced.

In addition, the same functions and effects as those of the first embodiment can be obtained.

Figure 18:
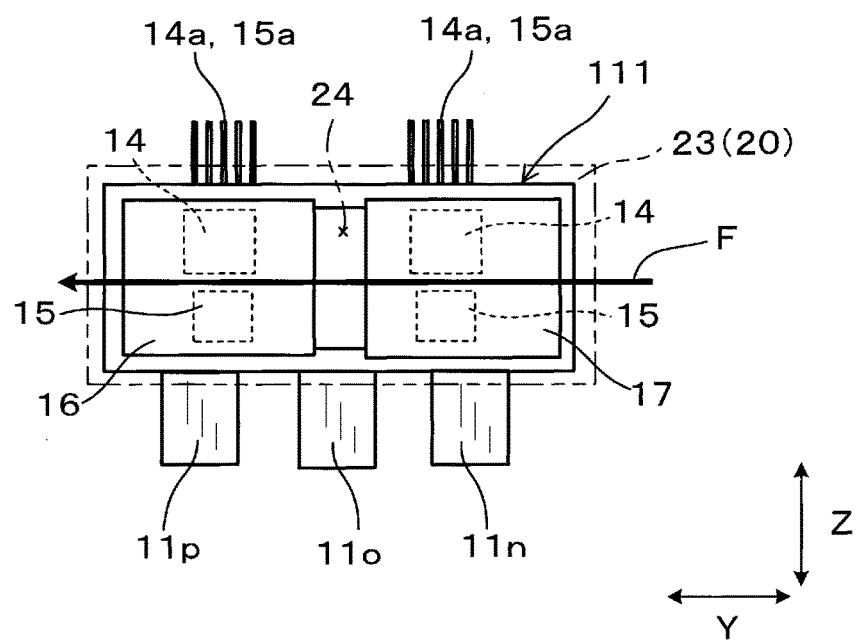
FIG. 18 shows a modification of FIG. 17.

Further, in connection with the arrangement of the switching elements (IGBT 14, MOSFET 15) as shown in FIG. 17, it is possible to adopt the arrangement of the switching elements as shown in FIG. 18.

The semiconductor module 111 shown in FIG. 18 is configured such that, in the same lead frame 16, the MOSFET 15 is disposed at the same position as the IGBT 14 with respect to the flow F of the refrigerant in the refrigerant passage 24 of the cooler 20, and in the same lead frame 17, the MOSFET 15 is disposed at the same position as the IGBT 14 with respect to the flow F of the refrigerant in the refrigerant passage 24 of the cooler 20.

Even in this case, as in the case of FIG. 17, in the same lead frame 16 or 17, the first-driven IGBT 14 is not disposed on a downstream side of the MOSFET 15 with respect to the flow F of the refrigerant in the refrigerant passage 24 of the cooler 20.

Therefore, also in the case of the arrangement of the switching elements as shown in FIG. 18, the first-driven IGBT 14 is not cooled after the MOSFET 15 is, the cooling of the IGBT 14 can be improved.

The present disclosure is not limited only to the above-described typical embodiments and various applications and modifications can be conceived without departing from the object of the present disclosure.

For example, it is also possible to implement each of the following embodiments to which the above embodiment is applied.

In the above embodiment, the case where the IGBT 14 and the MOSFET 15 of the semiconductor module 11 are arranged side by side in the direction intersecting the extending direction of the P terminal 11p and the N terminal 11n is exemplified.

However, as long as one switching element can be disposed at a position deviating from the conduction path of the other switching element, the arrangement relationship between the IGBT 14 and the MOSFET 15 can be appropriately changed.

In the above embodiment, the case where the first-driven switching element is configured not to be disposed on the downstream side of another switching element with respect to the flow of the refrigerant in the refrigerant passage 24 of the cooler 20 has been exemplified.

However, the arrangement relationship of the two switching elements with respect to the flow of the refrigerant in the refrigerant passage 24 is not limited thereto, and it can be changed as necessary.

The cooler 20 is described in which the cooling pipes 23 are disposed so as to be in contact with each of the two outer surfaces 11a, 11a of the semiconductor module 11 in the above embodiment.

However, instead of this cooler 20, a cooler configured so that a cooling surface thereof abuts only one outer surface 11a of the semiconductor module 11 may be adopted.

The case where the length of the conduction path Pa of the IGBT 14 in the semiconductor module 11 is shorter than the length of the conduction path Pb of the MOSFET 15 has been exemplified in the above embodiment.

However, it is also possible to adopt a configuration in which the lengths of the conduction path Pa and the conduction path Pb are the same, or a configuration in which the length of the conduction path Pa is longer than the length of the conduction path Pb if necessary.

Further, in the semiconductor module 111, it is also possible to adopt a configuration in which the length L1 of the conduction path formed between the high potential side line Lp and the low potential side line Ln via the two IGBTs 14, 14 and the length L2 of the conduction path formed between the high potential side line Lp and the low potential side line Ln via the two MOSFETs 15, 15 are the same, or a configuration in which the length L1 exceeds the length L2 if necessary.

The case of using the IGBT 14 composed of a Si-based material and the MOSFET 15 composed of a SiC-based material is exemplified in the above embodiment.

However, it is also possible to use an IGBT 14 composed of a material other than Si-based material and a MOSFET 15 composed of a material other than a SiC-based material if necessary.

What is claimed is:

1. A semiconductor module comprising:
   an IGBT and a MOSFET connected in parallel to each other and provided on a same lead frame; wherein,
   either one of the IGBT and the MOSFET is a first switching element and a remaining one is a second switching element; and
   the second switching element is disposed at a position that is separated from a conduction path of the first switching element in the same lead frame.

2. The semiconductor module according to claim 1, wherein,
   the semiconductor module includes a first terminal and a second terminal extending from the lead frame in parallel to each other; and
   the IGBT and the MOSFET are arranged side by side in a direction intersecting an extending direction of the first terminal and the second terminal.

3. The semiconductor module according to claim 2, wherein,
   the first switching element is driven prior to the second switching element; and
   a length of a first conduction path formed between the first terminal and the second terminal via the first switching element is configured to be shorter than a length of a second conduction path formed between the first terminal and the second terminal via the second switching element.

4. The semiconductor module according to claim 1, wherein,
   a cooler having a refrigerant passage extending to face the lead frame is attached to the semiconductor module; and
   the first switching element that is driven first is configured not to be disposed on a downstream side of the second switching element with respect to a flow of a refrigerant in the refrigerant passage of the cooler.

5. The semiconductor module according to claim 4, wherein,
   the semiconductor module is configured such that the first switching element that is driven first is disposed on an upstream side of the second switching element with respect to the flow of the refrigerant in the refrigerant passage of the cooler.

6. A semiconductor module comprising:
   a plurality of semiconductor element pairs of which IGBTs and MOSFETs thereof are connected in parallel to each other, the semiconductor element pairs being connected in series between a high potential side line and a low potential side line of a power supply, and provided on a same lead frame; wherein,
   either a plurality of the IGBTs or a plurality of the MOSFETs included in the plurality of semiconductor element pairs are a plurality of first switching elements and remaining ones are a plurality of second switching elements;
   the plurality of first switching elements are driven prior to the plurality of second switching elements;
   in a first semiconductor element pair disposed between the high potential side line and an AC output line among the plurality of semiconductor element pairs, the second switching element is disposed at a position separated from a conduction path formed between the high potential side line and the AC output line via the first switching element; and
   in a second semiconductor element pair disposed between the low potential side line and the AC output line among the plurality of semiconductor element pairs, the second switching element is disposed at a position separated from a conduction path formed between the low potential side line and the AC output line via the first switching element.

7. The semiconductor module according to claim 6, wherein,
   a length of a first conduction path formed between the high potential side line and the low potential side line which sequentially passes through the plurality of first switching elements is configured to be shorter than a length of a second conduction path formed between the high potential side line and the low potential side line which sequentially passes through the plurality of second switching elements.

8. The semiconductor module according to claim 6, wherein,
   a cooler having a refrigerant passage extending to oppose the lead frame is attached to the semiconductor module; and
   the first switching element that is driven first in each of the plurality of semiconductor element pairs is configured not to be disposed on a downstream side of the second switching element with respect to a flow of a refrigerant in the refrigerant passage of the cooler.

9. The semiconductor module according to claim 1, wherein,
   the first switching element is the IGBT composed of a Si-based material and the second switching element is the MOSFET composed of a wide band-gap semiconductor material.

10. The semiconductor module according to claim 6, wherein,
    the first switching element is the IGBT composed of a Si-based material and the second switching element is the MOSFET composed of a wide band-gap semiconductor material.

* * * * *